United States Patent [19]
Tsuyuki
[11] 3,912,555
[45] Oct. 14, 1975

[54] SEMICONDUCTOR INTEGRATED CIRCUIT AND METHOD FOR MANUFACTURING THE SAME

[75] Inventor: Tadaharu Tsuyuki, Isehara, Japan

[73] Assignee: Sony Corporation, Tokyo, Japan

[22] Filed: Sept. 18, 1973

[21] Appl. No.: 398,398

[30] Foreign Application Priority Data

Sept. 22, 1972 Japan ................................ 47-95341

[52] U.S. Cl. ..................... 148/175; 29/576; 29/577; 148/187; 148/191; 357/40; 357/44; 357/48; 357/90

[51] Int. Cl. ....... H01l 7/36; H01l 7/44; H01l 27/02

[58] Field of Search .................... 148/175, 187, 191; 317/235 E, 235 D, 235 WW; 29/576, 577; 357/40, 44, 48, 90

[56] References Cited

UNITED STATES PATENTS

| | | | |
|---|---|---|---|
| 3,595,713 | 7/1971 | Brebisson et al. | 148/175 |
| 3,638,079 | 1/1972 | Chan | 148/175 X |
| 3,767,486 | 10/1973 | Imaizumi | 148/175 |

FOREIGN PATENTS OR APPLICATIONS

| | | | |
|---|---|---|---|
| 1,510,057 | 11/1967 | France | 148/175 |

OTHER PUBLICATIONS

Chang et al., "Fabrication of PNP and NPN – – – Chip," I.B.M. Tech. Discl. Bull., Vol. 11, No. 12, May, 1969, pp. 1653–1654.

Jacobus et al., "Complementary Transistors," Ibid., Vol. 14, No. 4, Sept. 1971, p. 1045.

*Primary Examiner*—L. Dewayne Rutledge
*Assistant Examiner*—W. G. Saba
*Attorney, Agent, or Firm*—Hill, Gross, Simpson, Van Santen, Steadman, Chiara & Simpson

[57] ABSTRACT

An NPN transistor and a PNP transistor are formed in a common semiconductor chip in a vertical type arrangement. Both transistors have buried collector layers, each being under a base area. One of the buried collector layers is surrounded by a cup-shaped isolation area which is isolated by another isolation region which is a highly doped opposite conductivity type.

3 Claims, 20 Drawing Figures

SEMICONDUCTOR INTEGRATED CIRCUIT AND METHOD FOR MANUFACTURING THE SAME

FIELD OF THE INVENTION

This invention relates to a semiconductor integrated circuit (IC), and to a method of making the same, which contains electrically isolated complementary semiconductor devices, for example, an NPN and a PNP transistor. In particular, both transistors are a type of vertical transistor in order to obtain a good h.f. characteristic.

DESCRIPTION OF THE PRIOR ART

Constructing a transistor in a monolithic integrated circuit, the collector, base and emitter contacts must be positioned on the same side of a semiconductor chip. Consequently, there is a relative large resistance path from the collector regions to the collector metal contact on this side. A so-called "buried collector layer" is utilized, which is buried under the base region and doped highly in order to reduce said resistance.

Especially, the integrated circuit including complementary transistors, such as the PNP transistor and the NPN transistor, requires at least two different buried collector layers, that is, a highly doped P-type layer for the PNP transistor and a highly doped N-type layer for the NPN transistor. The simplicity of the forming process is also required in the practical fabrication. These two requirements create a dilemma.

One attempted solution is disclosed in U.S. Pat. No. 3,502,951, where the PNP transistor has a double "buried layer", one is P-type for collector and the other of N-type is for an electrical isolation from the NPN transistor. The second buried layer is formed simultaneously with the buried layer of NPN transistor.

In the prior art arrangement shown in FIG. 1, the NPN and the PNP transistors are formed on a common silicon substrate 1 of P-type. The NPN transistor comprises a buried collector layer 2 of highly doped N-type, a collector region 3 of N-type, a base region 4 of P-type, and an emitter region 5 of N-type.

On the other hand, the PNP transistor comprises a buried collector layer 6 of P-type, a base region 7 of N-type, and an emitter region 8 of P-type.

The collector region 3 formed by an epitaxial technique is electrically isolated from a part of the epitaxial layer 10 of N-type and from the PNP transistor, by the diffused isolation region 9.

A buried isolation layer 11 of N-type is formed by the diffusion simultaneously with the buried collector layer 2 of the NPN transistor. The diameter of the layer 11 is formed larger than the buried collector layer 6 of the PNP transistor connecting to the epitaxial layer 10 at its edge portion. Consequently, the PNP transistor is wholly surrounded by the ring shaped epitaxial layer 10 and the buried isolation layer 11.

This prior art device shown in FIG. 1, however, has a weak point, namely, the buried isolation layer 11 has a limitation of impurity concentration according to the relation with the buried collector layer 6 of the PNP transistor. For this reason, the simultaneously diffused collector 2 can not have enough high impurity concentration, which results in a high collector saturation resistance. Even if the concentration of the buried isolation layer 11 is made high, the breakdown voltage of the PNP transistor becomes low, especially between the buried collector layer 6 and the buried isolation layer 11.

The second type of prior art device is shown in FIG. 2, which has similar problems. The buried collector layer 6 of the PNP transistor is formed in the first epitaxial layer of P-type surrounded by the buried isolation layer 11 of N-type. The buried isolation layer 11 consists of a relatively low impurity concentration region 12 and a relatively high impurity concentration region 13 which surrounds the region 12 and are connected to the floating layer 10 of the second epitaxial layer.

The buried collector layer 2 of the NPN transistor is diffused simultaneously with the diffusion of the relatively high impurity concentration region 12.

This prior art shown in FIG. 2 has another weak point. The impurity concentration of the buried isolation layer 11, especially the layer 13 and the buried collector layer 2 are very high and it sometimes causes an undesired diffusion on the surface of the P-type substrate 1, while the first epitaxial layer is grown. A thin layer 14 of N-type occurs and makes a shorted path between the buried collector layer 2 and the buried isolation layer 11.

A resembling method or process is proposed in U.S. Pat. No. 3,479,233, which has a U-shaped buried collector layer.

SUMMARY OF THE INVENTION

The present invention provides an integrated circuit having complementary transistors therein, in which the buried collector layer of a first transistor (for example, an NPN transistor) and the buried isolation layer of a second transistor (for example, a PNP transistor) are formed simultaneously, and are isolated by a selective diffusion of an opposite type region between the two layers. After a double epitaxial growth of opposite type conductivity, each transistor is formed by a diffusion technique.

The object of this invention is to provide an improved monolithic integrated circuit which includes complementary transistors.

Another object is to provide novel, improved isolation characteristics and reliability between two transistors.

A further object is to provide a high breakdown voltage in such device.

DESCRIPTION OF PREFERRED EMBODIMENTS

Figure 1:
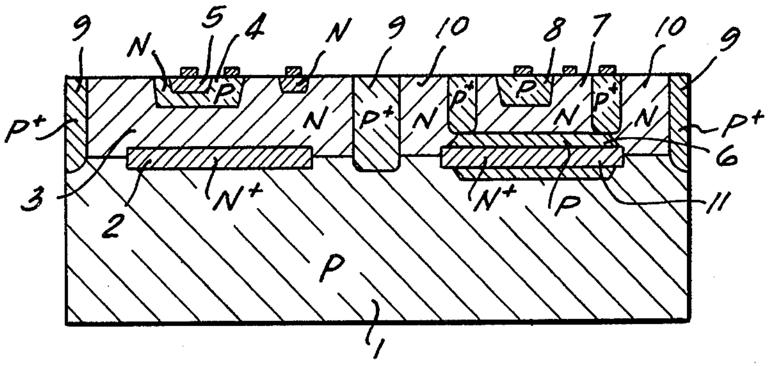
FIG. 1 (PRIOR ART)
FIG. 1 is a cross sectional view of a prior art device.
Figure 2:
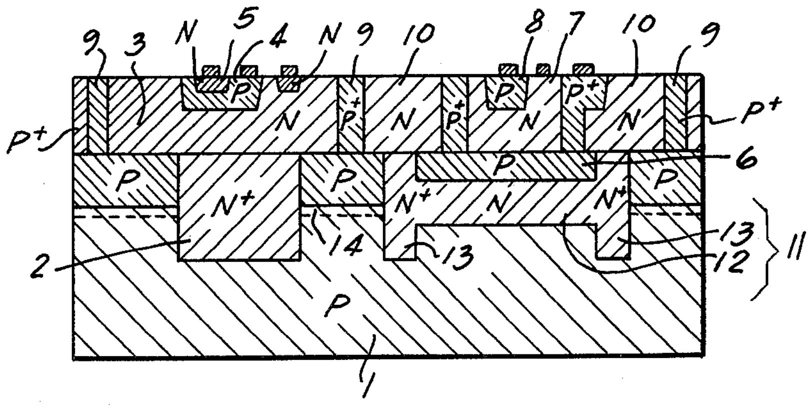
FIG. 2 (PRIOR ART)
FIG. 2 is a cross sectional view of another prior art device.
Figure 3:
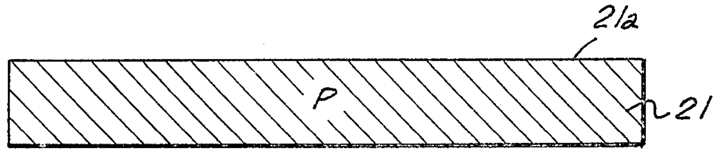
FIGS. 3 to 17 are sectional views illustrating successive steps of forming the novel device of the present invention.
Figure 4:
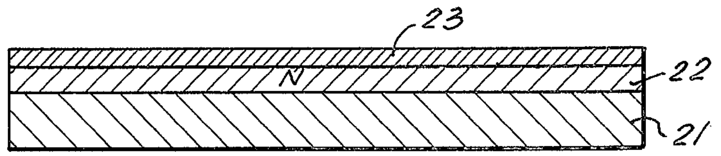

Referring to FIGS. 1 to 17, a semiconductor substrate 21 is prepared, which is P-type silicon having an impurity concentration of about $4 \times 10^{15}$ atoms/cm$^3$ (FIG. 3). An N-type semiconductor layer 22 is formed by the diffusion upon one major surface 21*a* of the substrate 21 (FIG. 4). The surface impurity concentration of the N-type layer 22 is about $10^{17}$ atoms/cm$^3$. Its thickness is about 0.5 microns.

Figure 5:
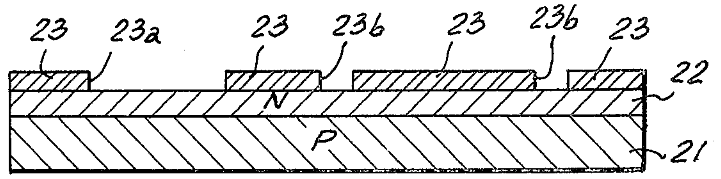

In FIG. 5, a diffusion mask 23 such as silicon dioxide ($SiO_2$), which is deposited during the diffusion step, is selectively etched by a photo-etching technique and windows 23*a* and 23*b* are opened.

Figure 18:
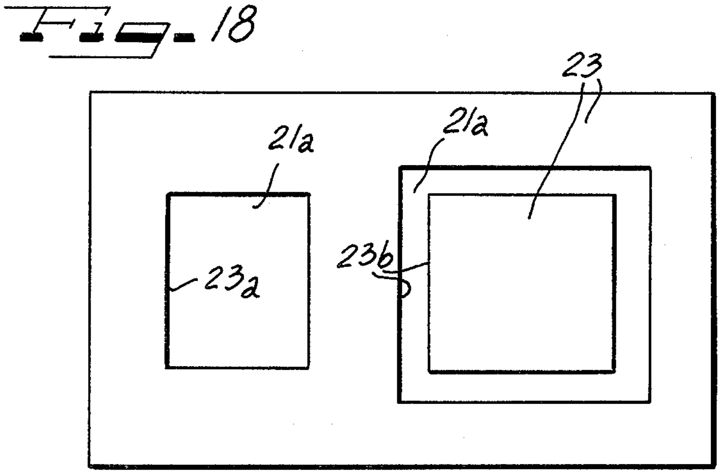
FIGS. 18, 19 and 20 are plan views of the present invention at certain stages in its fabrication.

FIG. 18 shows a plan view of the step corresponding to FIG. 5, where the window 23*a* is rectangular and the window 23*b* is ring-shaped.

Figure 6:
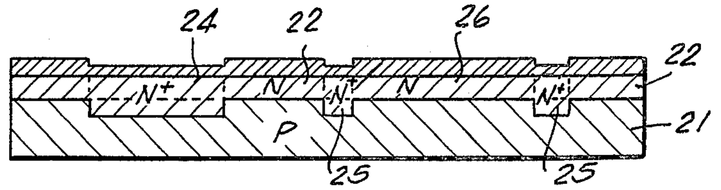

In FIG. 6, an N-type impurity material is diffused through the windows 23*a* and 23*b* forming relatively high impurity concentration regions 24 and 25 in the N-type layer 22. A surface impurity concentration of layers 24 and 25 is about $5 \times 10^{18}$ atoms/cm$^3$ which is higher than that of the N-type layer 22. A relatively highly doped layer 25 is diffused through the ring-shaped window 23*b* which surrounds the relatively low doped layer 26 which is a part of the N-type layer 22.

Figure 7:
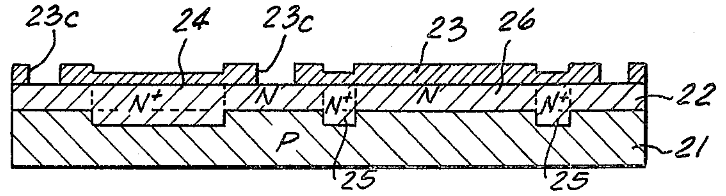
Figure 19:
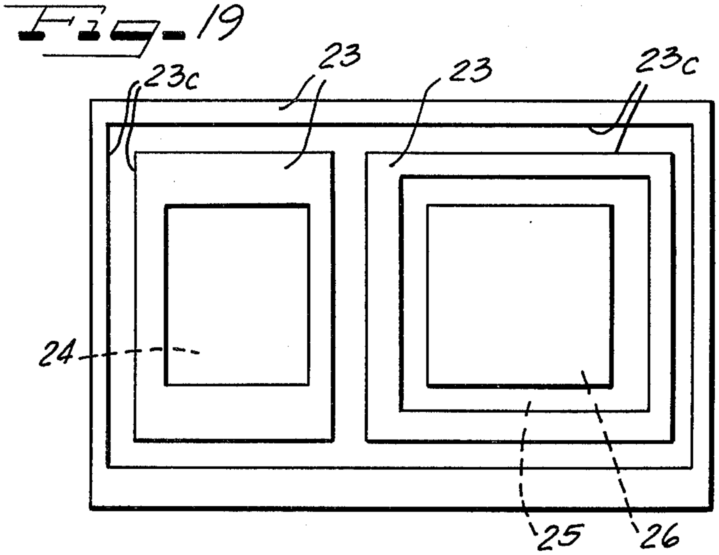

In FIG. 7, the diffusion mask 23 is etched and forms different windows 23*c*. FIG. 19 shows a plan view of the step corresponding to the FIG. 7, where the window 23*c* is of grid-like shape and surrounds two relatively high doped layers 24 and 25.

Figure 8:
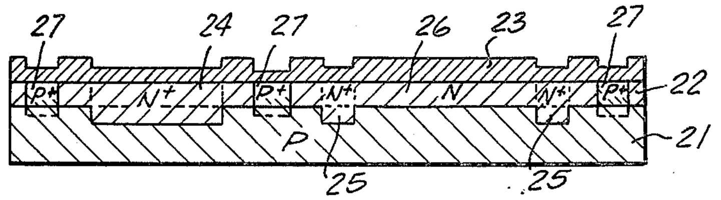

In FIG. 8, the second selective diffusion is provided with a P-type impurity material through the window 23*c* forming an isolation area 27. The isolation area 27 has a surface impurity concentration of about $10^{19}$ atoms/cm$^3$ which is higher than the N-type layer 22 in absolute value, and it is formed penetrating the N-type layer 22 to the P-type substrate 21. This process in FIG. 8 is one of the most important features of this invention. The steps shown in FIGS. 6 and 8 are interchangeable.

Figure 9:
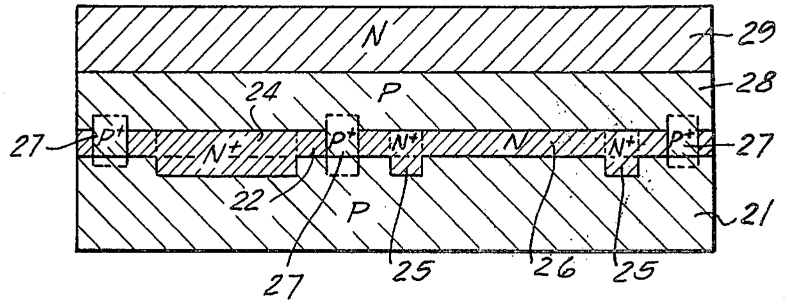

In FIG. 9, after removing the $SiO_2$ mask 23, double layers 28 and 29 of silicon are deposited by an epitaxial technique. The first epitaxial layer 28 is P-type, the same as the substrate 21. Its thickness is about 8 microns and the specific resistance is 0.352 ohm-cm. The second epitaxial layer 29 is N-type, which is continuously deposited on the first epitaxial layer 28 without withdrawing the substrate from an epitaxial belljar, but only exchanging an impurity material in an epitaxial atmosphere, for example, from Boron for the first layer 28 to Phosphor for the second layer 29. The layer 29 has a specific resistance of about 1 ohm-cm. and a thickness of about 9 microns. The specific resistance of the first layer 28 is lower than that of the second layer 29, in order to make the buried collector layer in the second layer 28.

Figure 10:
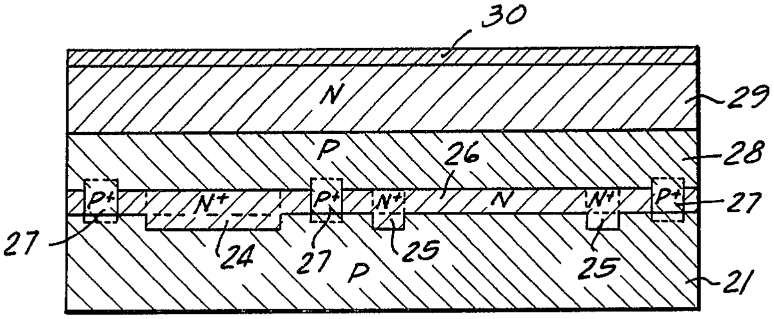
Figure 11:
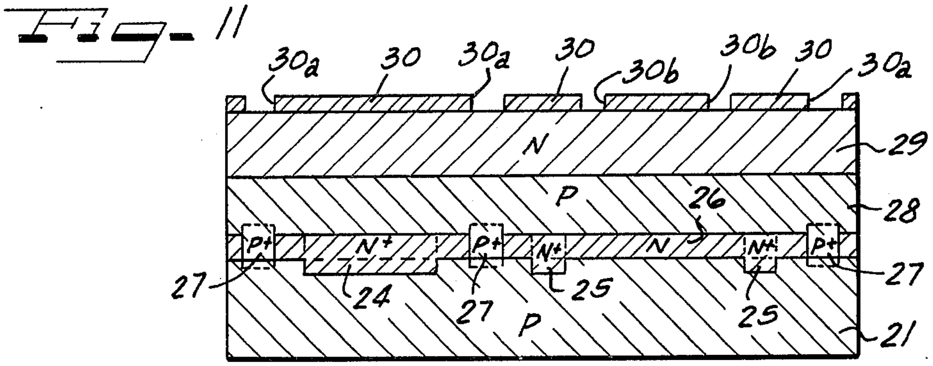
Figure 20:
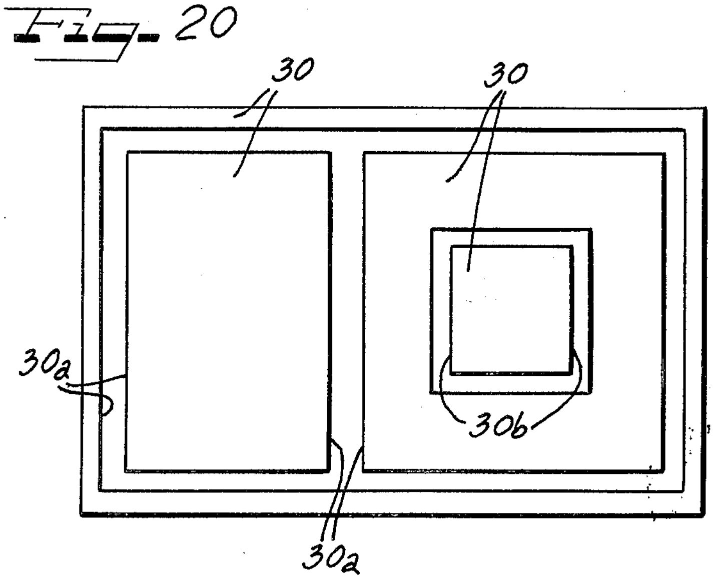

In FIG. 10, a diffusion mask 30 is formed upon the second epitaxial layer 29, for example, silicon dioxide ($SiO_2$). In FIG. 11, the mask 30 is selectively photo-etched and to form a plurality of windows 30*a* and 30*b*. FIG. 20 shows an etched pattern, a plan view of the step corresponding to the FIG. 11, including windows 30*a* and 30*b*. The window 30*a* has the same pattern as the window 23*c* which is opened in the mask 23 and shown in FIG. 19. The window 30*b* has a ring shape smaller than the pattern of the window 23*b* shown in FIG. 18.

Figure 12:
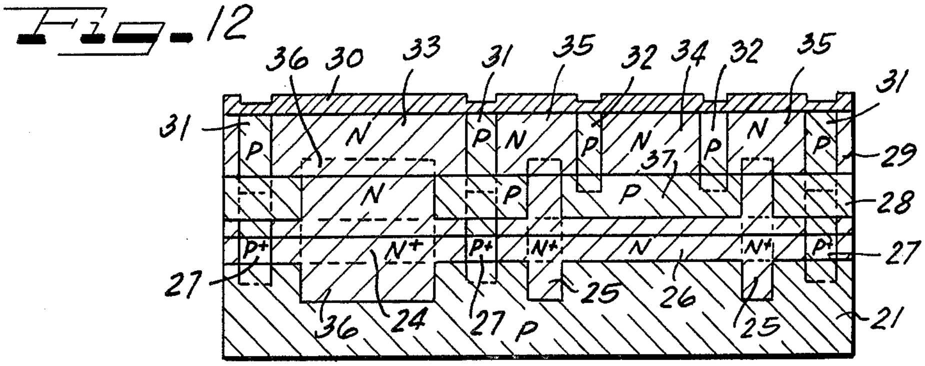

In FIG. 12, a P-type impurity is diffused through windows 30*a* and 30*b* into the second epitaxial layer 29 and forms P-type regions 31 and 32, reaching toward the first epitaxial layer 28. The P-type region 31 diffused through the window 30*a* divides an isolated N-type collector region 33 from other parts of the second epitaxial layer 29. Another P-type region 32 diffused through the window 30*b* divides an isolated N-type base region 34 and the N-type isolation layer 35. The region 32 becomes a collector lead region of the PNP transistor.

During the diffusion process, a re-diffusion of the buried layer occurs.

The relatively high-doped layer 24 forms an N-type region 36, having an upper part which reaches toward the N-type collector region 33. Another relatively high-doped layer 25 reaches toward the N-type isolation layer 35. The relatively low-doped layer 26 does not reach toward the second epitaxial layer 29.

A pair of N-type regions 25 and 26 isolate a P-type buried collector layer 37.

The P-type isolation region 27 reaches toward the upper P-type isolation region 31 and achieves the isolation.

A pair of islands are formed in which the NPN and PNP transistors are formed.

Figure 13:
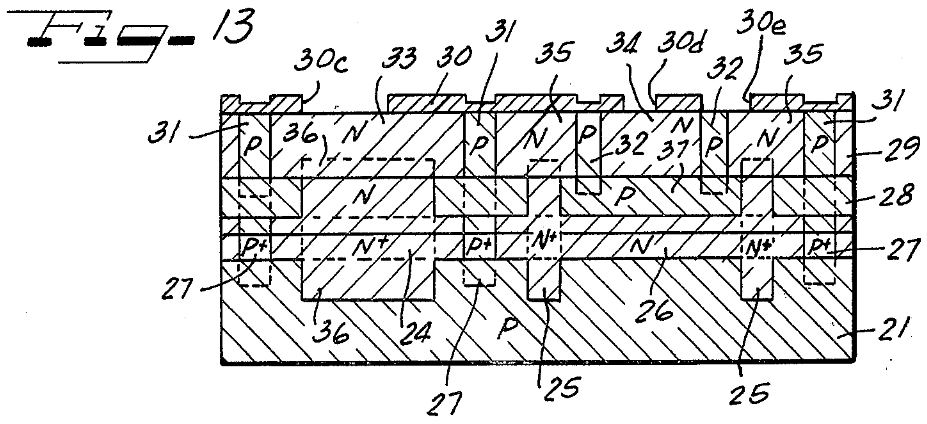

In FIG. 13, a plurality of windows 30*c*, 30*d* and 30*e* are opened in the mask 30 for a diffusion of a P-type impurity material into the N-type second epitaxial layer 29. The window 30*c* is formed for a base diffusion of the NPN transistor. The window 30*d* is formed for an emitter diffusion of the PNP transistor. The window 30*e* is formed for a collector-contact-region diffusion of the PNP transistor.

Figure 14:
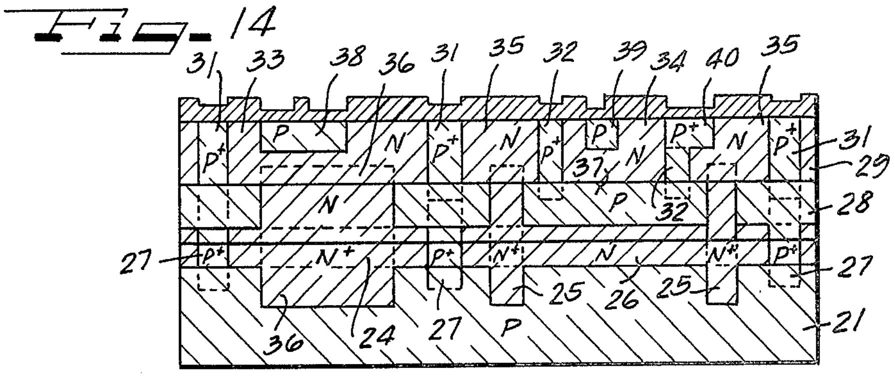

In FIG. 14, P-type areas 38, 39 and 40 are formed in the second epitaxial layer 29. The P-type base region 38 is formed in the N-type collector region 33 of the NPN transistor. The P-type emitter region 39 is formed in the N-type base region 34 of the PNP transistor. The P-type supplement region 40 is formed connecting with the P-type collector lead region 32 in order to increase an area of the collector metal contact.

Figure 15:
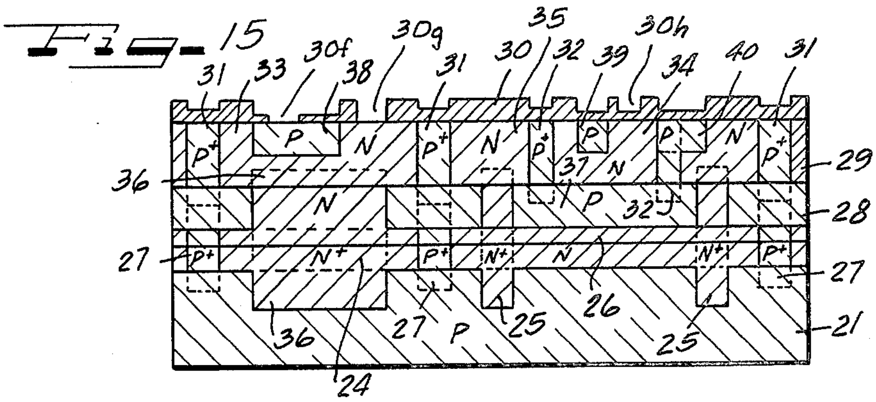

In FIG. 15, a plurality of windows 30*f*, 30*g* and 30*h* are opened in the mask 30. The window 30*f* is for the emitter diffusion of the NPN transistor. The window 30*g* is for a collector contact diffusion of the NPN transistor. The window 30*h* is for a base contact diffusion of the PNP transistor.

Figure 16:
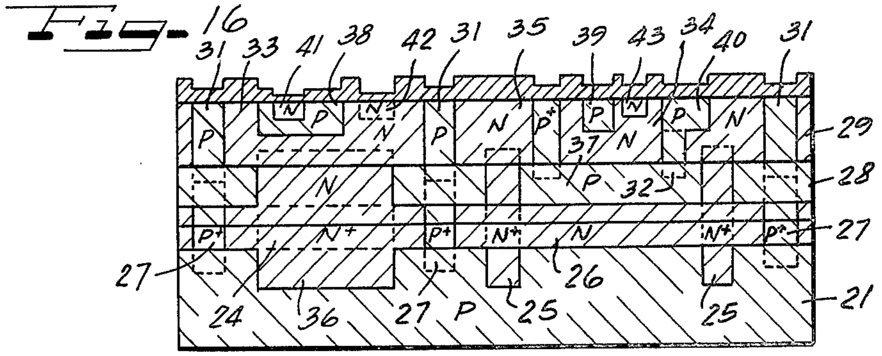

In FIG. 16, an N-type impurity material is diffused through these windows 30*f*, 30*g* and 30*h* into the second epitaxial layer 29. An N-type emitter region 41 is formed in the base region 38 of the NPN transistor. An N-type collector contact region 42 is formed in the N-type collector region 33 of the NPN transistor. An N-type base contact region 43 is formed in the N-type base region 34 of the PNP transistor.

Figure 17:
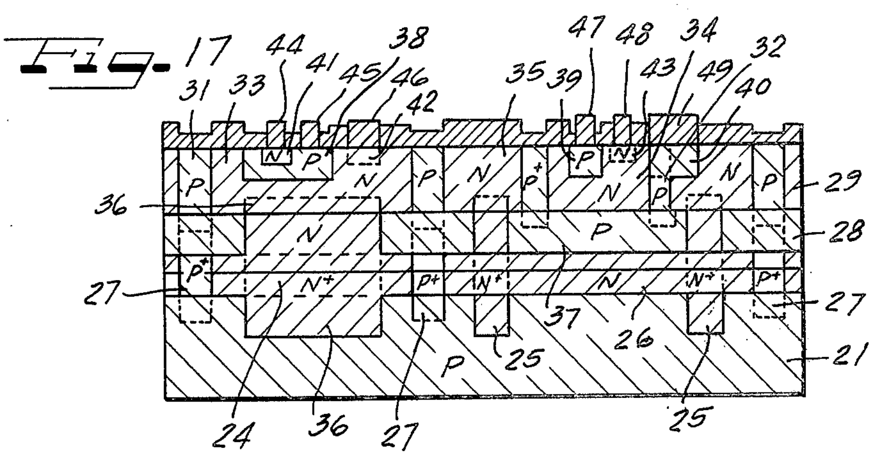

In FIG. 17, a plurality of metal electrodes are deposited on suitable portions of the chip such as an emitter electrode 44, a base electrode 45 and a collector electrode 46 of the NPN transistor and an emitter electrode 47, a base electrode 48 and a collector electrode 49 of the PNP transistor. FIG. 17 shows a final view of the complementary transistor device. An earth potential is given to the P-type substrate 21 for isolation. The highest potential of a circuit is given to the N-type isolation areas 35, 25 and 26 for the isolation.

It will be noted that conductivity types can be interchanged. Boron is used as an N-type impurity material in diffusion process. Phosphor is used as a P-type impurity material.

It will be apparent to those skilled in the art that many modifications and variations may be effected without departing from the spirit and scope of the novel concepts of the present invention.

I claim as my invention:

1. A method for the manufacture of a semiconductor integrated circuit comprising:

a. taking a semiconductor substrate of a first impurity type;

b. forming by diffusion a first layer on said substrate over one major surface thereof of the opposite impurity type from that of said substrate;

c. forming a highly doped island region of said opposite impurity type and a highly doped ring shaped region of said opposite impurity type by diffusion in said first layer, said island region and said ring shaped region being laterally spaced from each other and extending through said first layer and partially into said substrate;

d. forming by diffusion a highly doped isolation ring of said first impurity type around said island region and spaced therefrom;

e. forming by diffusion around said ring shaped region a highly doped isolation ring and in laterally spaced position therefrom;

f. said isolation rings extending completely through said first layer and into said substrate;

g. depositing by an epitaxial technique a first epitaxial layer of said first impurity type and then by continuing epitaxial growth depositing a second epitaxial layer of said opposite impurity type;

h. the height of said first impurity type isolation ring being upwardly extended by up-diffusion into said first epitaxial layer;

i. the height of said island region and said ring shaped region being upwardly extended by up-diffusion through said first epitaxial layer and into said second epitaxial layer;

j. further extending the extent of said isolation rings so that they extend completely through said first and second epitaxial layers by downward diffusion from the outer surface of said second epitaxial layer, the last said down diffusion being of said first impurity type and of less doping concentration than that of said isolation rings in said first diffusion layer;

k. the length of said ring shaped region being extended upwardly by up diffusion from said ring shaped region through said first epitaxial layer and into said second epitaxial layer;

l. diffusing a second ring shaped region of said first impurity type through said second epitaxial layer and into said first epitaxial layer and of smaller diameter than that of said first ring shaped region;

m. diffusing a second island region of said first impurity type partially into said second epitaxial layer from its outer surface which is of smaller lateral extent than said first island region and located thereabove;

n. diffusing a third island region of said first impurity type into said second epitaxial layer inside of said second ring shaped region;

o. diffusing a fourth island region of said second impurity type partially into said second island region; and p. providing electrode connections to said first, second, third and fourth island regions, to the region of said second epitaxial layer lying within said second ring shaped region, and to the portion of said first epitaxial layer lying below said second ring shaped region.

2. A method according to claim 1, in which said one impurity type is P-type and in which said other impurity type is N-type.

3. A method according to claim 2, in which the semiconductor material is silicon.

* * * * *